US010178793B1

(12) United States Patent
Hsu et al.

(10) Patent No.: US 10,178,793 B1
(45) Date of Patent: Jan. 8, 2019

(54) RACK-MOUNT CHASSIS

(71) Applicant: Advanced Connectek Inc., New Taipei (TW)

(72) Inventors: Huan-Pin Hsu, New Taipei (TW); Chih-Jen Hsiao, New Taipei (TW)

(73) Assignee: Advanced Connectek Inc., New Taipei (TW)

( * ) Notice: Subject to any disclaimer, the term of this patent is extended or adjusted under 35 U.S.C. 154(b) by 0 days.

(21) Appl. No.: 16/041,852

(22) Filed: Jul. 23, 2018

(30) Foreign Application Priority Data

Aug. 8, 2017 (TW) .............................. 106211699 U

(51) Int. Cl.
    *H05K 7/14*         (2006.01)
    *H05K 5/02*         (2006.01)
    *E05D 7/12*         (2006.01)

(52) U.S. Cl.
CPC ........... *H05K 7/1488* (2013.01); *E05D 7/123* (2013.01); *H05K 5/0226* (2013.01); *H05K 5/0239* (2013.01); *E05D 2007/128* (2013.01)

(58) Field of Classification Search
CPC ... H05K 7/1488; H05K 5/0226; H05K 5/0239
See application file for complete search history.

(56) References Cited

U.S. PATENT DOCUMENTS

| | | | | |
|---|---|---|---|---|
| 5,146,650 | A * | 9/1992 | Robertson | ............. E05D 7/1077 16/259 |
| 6,123,401 | A * | 9/2000 | Chiba | ................. H04M 1/0216 16/332 |
| 2005/0105268 | A1* | 5/2005 | Chen | ..................... H05K 5/0239 361/692 |
| 2009/0279250 | A1* | 11/2009 | Li | ........................... G06F 1/187 361/679.58 |
| 2012/0061335 | A1* | 3/2012 | Fan | ...................... H05K 5/0239 211/26 |
| 2013/0314856 | A1* | 11/2013 | Mao | ........................ H05K 5/03 361/679.01 |

* cited by examiner

Primary Examiner — Adrian S Wilson
(74) Attorney, Agent, or Firm — JCIPRNET

(57) ABSTRACT

A rack-mount chassis includes a rear casing, a door plate, a first pivot assembly, and a second pivot assembly. The rear casing has an opening. The door plate is configured to shield the opening. The first pivot assembly includes a first bearing portion and a first shaft portion. The first bearing portion has a first shaft hole and a first passage. The first passage extends from the first shaft hole to an outer edge of the first bearing portion. The first shaft portion has a first shaft body. The first shaft body is moved into the first shaft hole through the first passage. The second pivot assembly includes a second bearing portion and a second shaft portion. The second bearing portion has a second shaft hole. The second shaft portion has a second shaft body. The second shaft body is located in the second shaft hole.

14 Claims, 18 Drawing Sheets

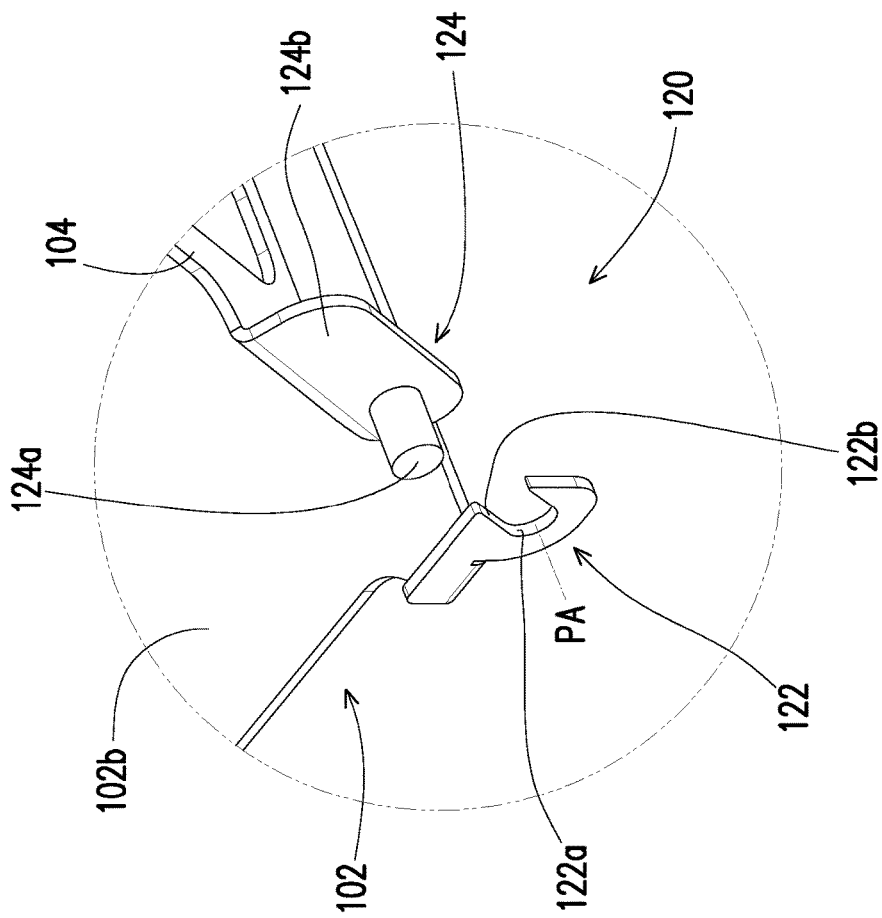

RACK-MOUNT CHASSIS

CROSS-REFERENCE TO RELATED APPLICATION

This application claims the priority benefit of Taiwan patent application serial no. 106211699, filed on Aug. 8, 2017. The entirety of the above-mentioned patent application is hereby incorporated by reference herein and made a part of the specification.

BACKGROUND OF THE INVENTION

1. Field of the Invention

The invention relates to a rack-mount part. More particularly, the invention relates to a rack-mount chassis.

2. Description of Related Art

In the placement operations of related electronic modules and optical fiber cables of servers and network equipment, rack-mount cabinets allow space to be used flexibly. The rack-mount cabinets generally include rack bodies and chassis installed on the rack bodies. The number of the chassis installed on the rack bodies may be increased and decreased as required, or the chassis may be replaced as required, as long as the rack bodies and the chassis are complied with the same specifications. Some types of the chassis (e.g., network equipment) are equipped with door plates, and the door plates are directly pivoted onto rear casings of the chassis most of the time. The door plates may be flipped open from top down and flipped closed from bottom up. Nevertheless, as the door plates are directly pivoted onto the rear casings of the chassis, the door plates may not be replaced conveniently.

SUMMARY OF THE INVENTION

The invention provides a rack-mount chassis with a detachable pivot assembly which allows a door plate to be replaced more conveniently.

A rack-mount chassis provided by an embodiment of the invention includes a rear casing, a door plate, a first pivot assembly, and a second pivot assembly. The rear casing has an opening. The door plate is configured to shield the opening. The first pivot assembly is connected between the rear casing and the door plate along a pivot axis. The first pivot assembly includes a first bearing portion and a first shaft portion. The first bearing portion is connected to one of the rear casing and the door plate and has a first shaft hole and a first passage. The first passage extends from the first shaft hole to an outer edge of the first bearing portion. The first shaft portion is connected to the other one of the rear casing and the door plate and has a first shaft body. The first shaft body is moved into the first shaft hole through the first passage. The second pivot assembly is connected between the rear casing and the door plate along a pivot axis. The second pivot assembly includes a second bearing portion and a second shaft portion. The second bearing portion is connected to one of the rear casing and the door plate and has a second shaft hole. The second shaft portion is connected to the other one of the rear casing and the door plate and has a second shaft body. The second shaft body is located in the second shaft hole.

In an embodiment of the invention, the first shaft body is plate-like, a thickness of the first shaft body is less than or equal to a width of the first passage, and the width of the first passage is less than or equal to an inner diameter of the second shaft hole.

In an embodiment of the invention, the first shaft body is cylindrical-shaped, an outer diameter of the first shaft body is less than or equal to the width of the first passage.

In an embodiment of the invention, the rear casing has a bottom wall when the first bearing portion is connected to the rear casing, and an included angle between an extending direction of the bottom wall and an extending direction of the first passage is less than or equal to 90 degrees.

In an embodiment of the invention, an included angle between an extending direction of the door plate and the extending direction of the first passage is less than or equal to 90 degrees when the first bearing portion is connected to the door plate.

In an embodiment of the invention, the first shaft portion further includes a first limiting piece, and the first shaft body is connected to the other one of the rear casing and the door plate through the first limiting piece.

In an embodiment of the invention, the second shaft body is inserted into the second shaft hole along the pivot axis.

In an embodiment of the invention, the second bearing portion further includes a second passage, wherein the second passage extends from the second shaft hole to an outer edge of the second bearing portion, and the second shaft body is moved into the second shaft hole through the second passage.

In an embodiment of the invention, the second shaft body is plate-like, a thickness of the second shaft body is less than or equal to a width of the second passage, and the width of the second passage is less than or equal to an inner diameter of the second shaft hole.

In an embodiment of the invention, the second shaft body is cylindrical-shaped, an outer diameter of the second shaft body is less than or equal to the width of the second passage.

In an embodiment of the invention, the rear casing has the bottom wall when the second bearing portion is connected to the rear casing, and the included angle between the extending direction of the bottom wall and an extending direction of the second passage is less than or equal to 90 degrees.

In an embodiment of the invention, the included angle between the extending direction of the door plate and the extending direction of the second passage is less than or equal to 90 degrees when the second bearing portion is connected to the door plate.

In an embodiment of the invention, the second shaft portion further includes a second limiting piece, and the second shaft body is connected to the other one of the rear casing and the door plate through the second limiting piece.

In an embodiment of the invention, the rack-mount chassis further includes a fastening assembly connected between the rear casing and the door plate, so as to fasten a portion of the door plate away from the pivot axis to a portion of the rear casing away from the pivot axis.

Based on the above, the detachable pivot assembly provided by the embodiments of the invention allows the door plate to be replaced more conveniently. Therefore, when the door plate is selective (e.g., the door plate may be transparent or opaque), the door plate may be replaced conveniently.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated

FIG. 6 is an exploded view of a second pivot assembly of a rack-mount chassis according to another embodiment of the invention.

DESCRIPTION OF THE EMBODIMENTS

Figure 1A:
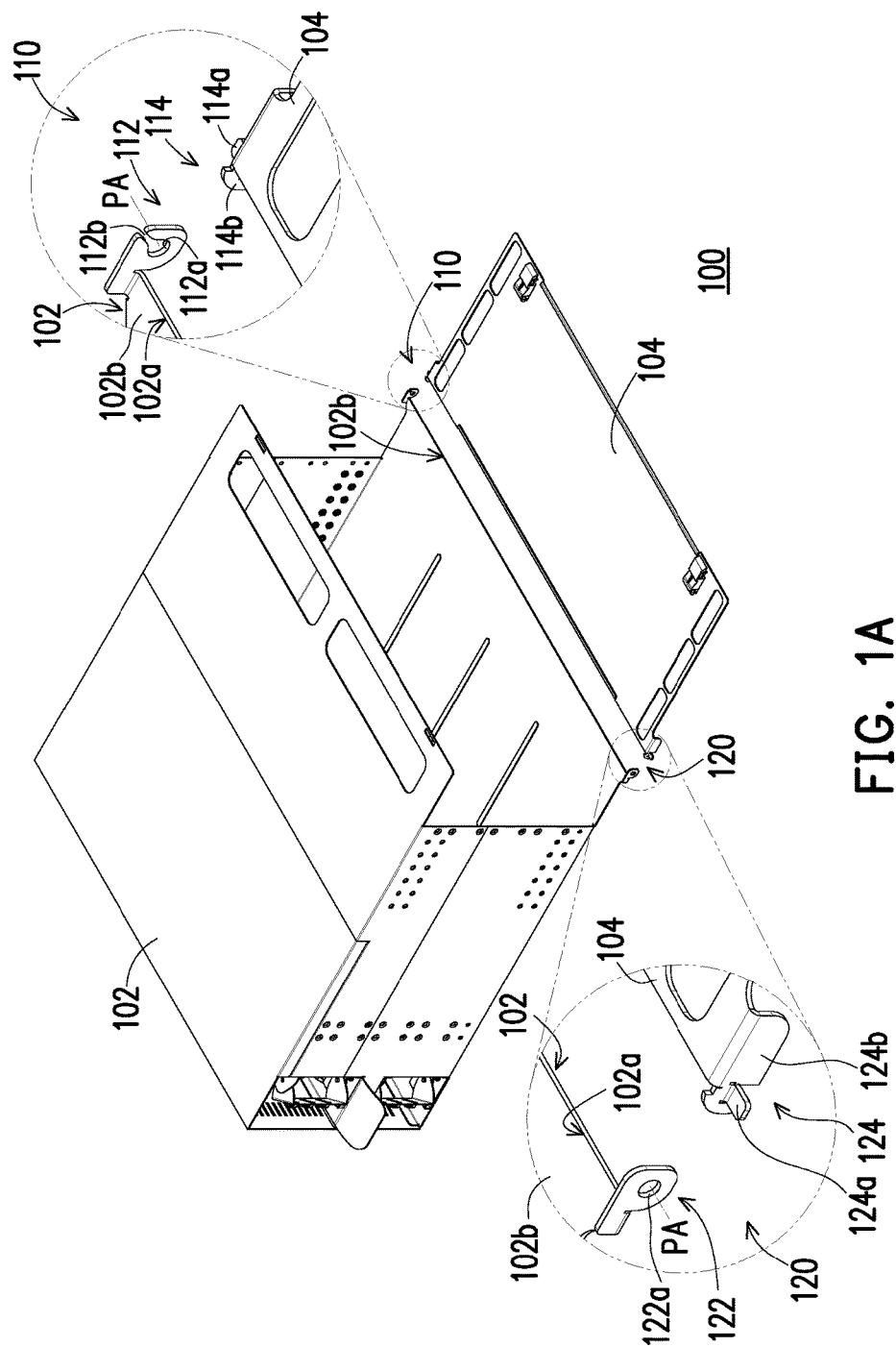
FIG. 1A to FIG. 1G illustrate an assembly and using process of a rack-mount chassis according to an embodiment of the invention.

Referring to FIG. 1A, in this embodiment, a rack-mount chassis 100 is, for example, applied to network equipment or a server apparatus. The rack-mount chassis 100 includes a rear casing 102, a door plate 104, a first pivot assembly 110, and a second pivot assembly 120. The rear casing 102 has an opening 102a, and the door plate 104 is configured to cover and shield the opening 102a. The door plate 104 is pivoted to the rear casing 102 along a pivot axis PA through the first pivot assembly 110 and the second pivot assembly 120 for shielding or opening the opening 102a of the rear casing 102. The door plate 104 may be transparent or opaque.

Figure 1B:
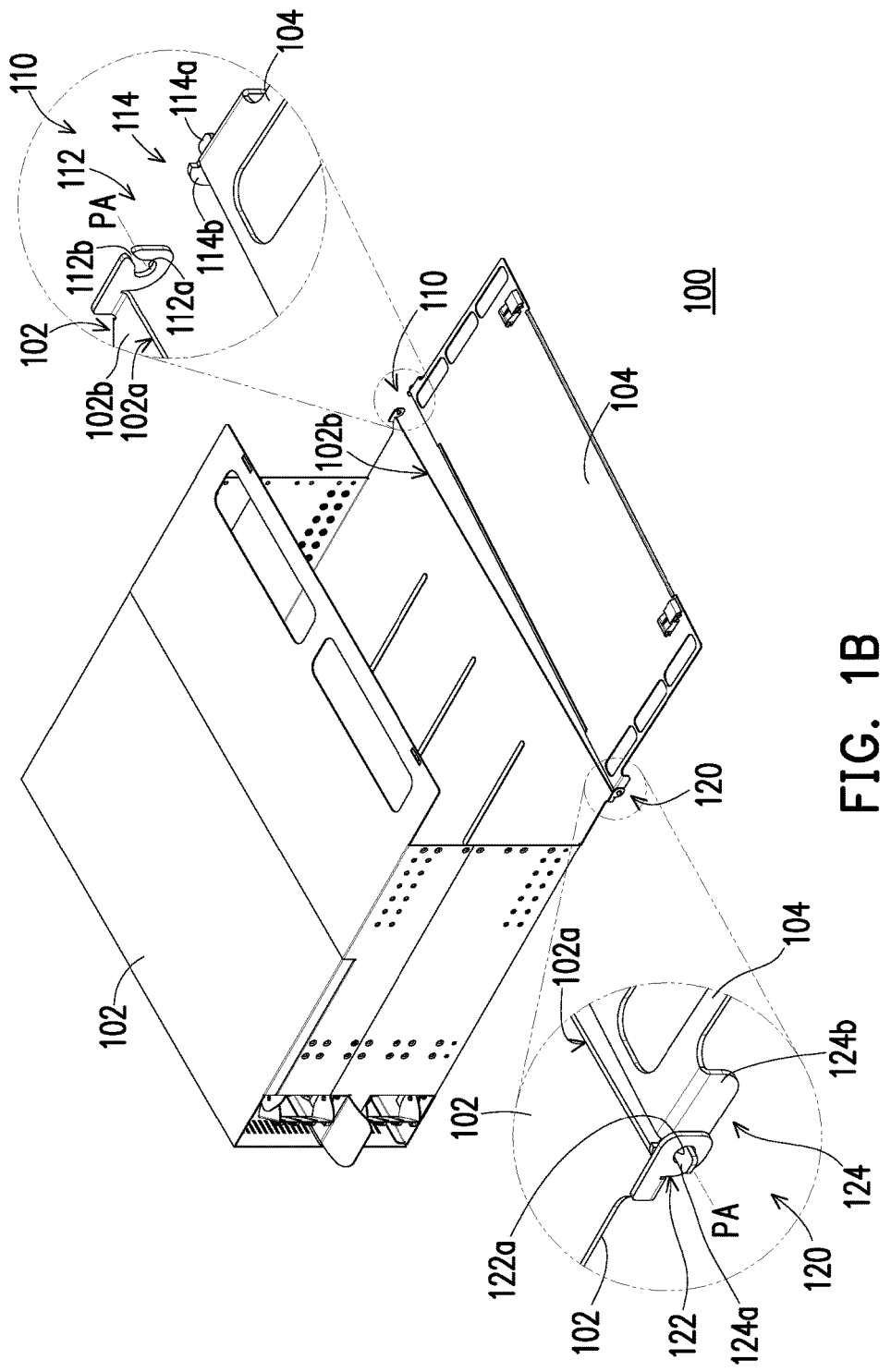

Referring to FIG. 1A to FIG. 1B, the second pivot assembly 120 is connected between the rear casing 102 and the door plate 104 along the pivot axis PA. The second pivot assembly 120 includes a second bearing portion 122 and a second shaft portion 124. The second bearing portion 122 is connected to one of the rear casing 102 and the door plate 104 (e.g., the rear casing 102 in this embodiment) and has a second shaft hole 122a. The second shaft portion 124 is connected to the other one of the rear casing 102 and the door plate 104 (e.g., the door plate 104 in this embodiment) and has a second shaft body 124a. The second shaft body 124a is located in the second shaft hole 122 for limiting the door plate 104 to pivot relative to the rear casing 102. In this embodiment, the second shaft body 124a is inserted into the second shaft hole 122a along the pivot axis PA.

Figure 1C:
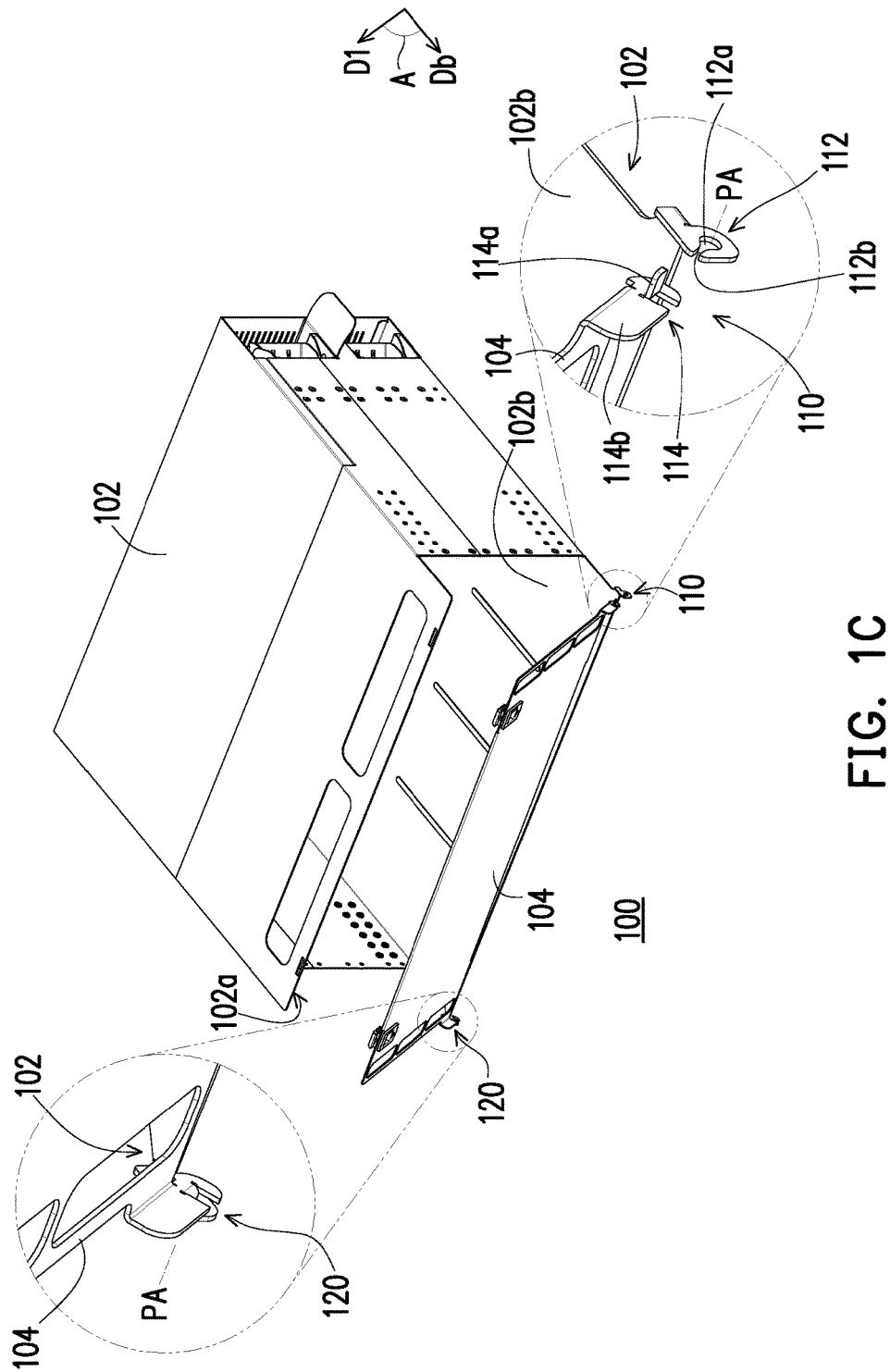
Figure 1D:
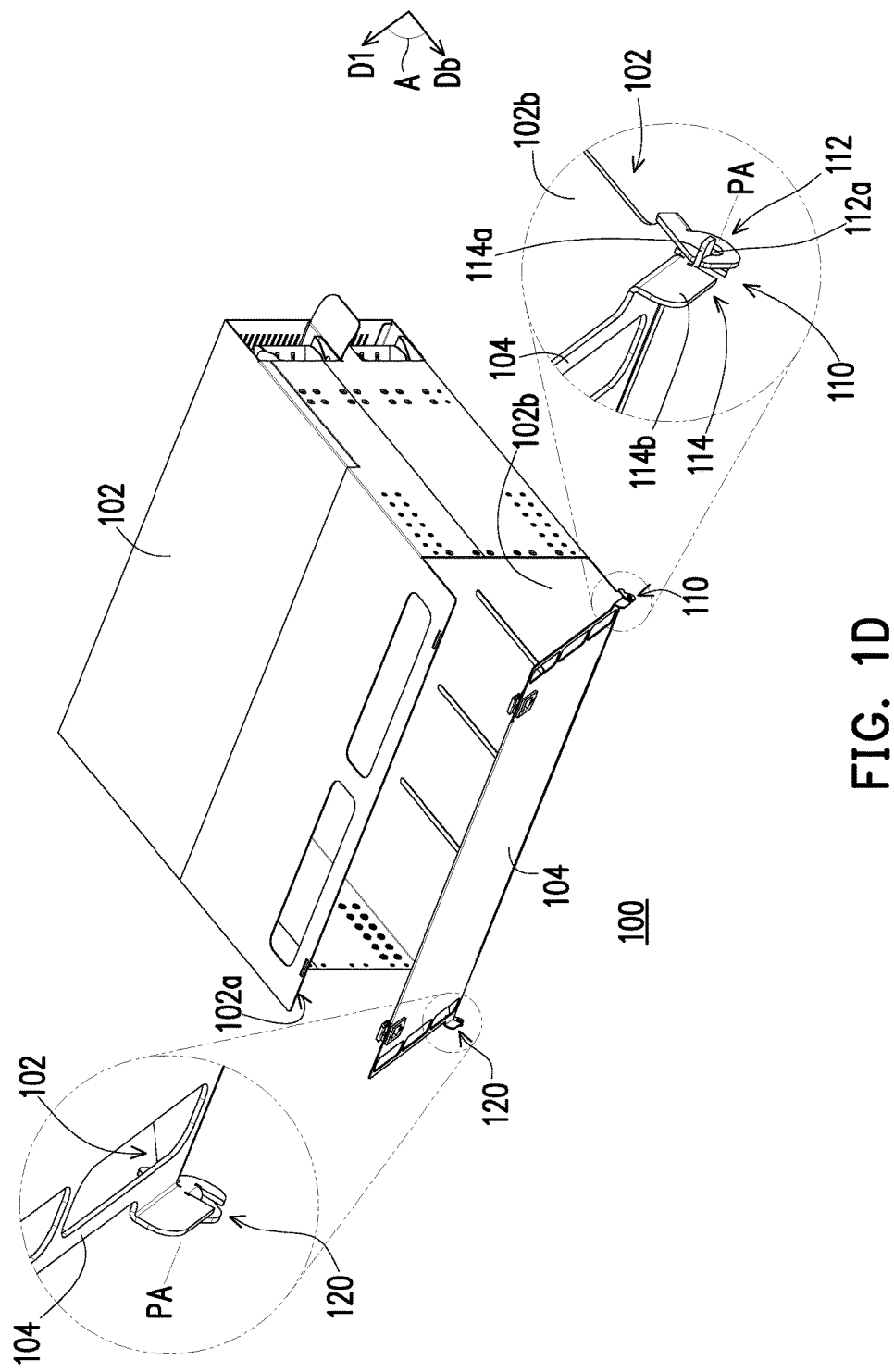
Figure 1E:
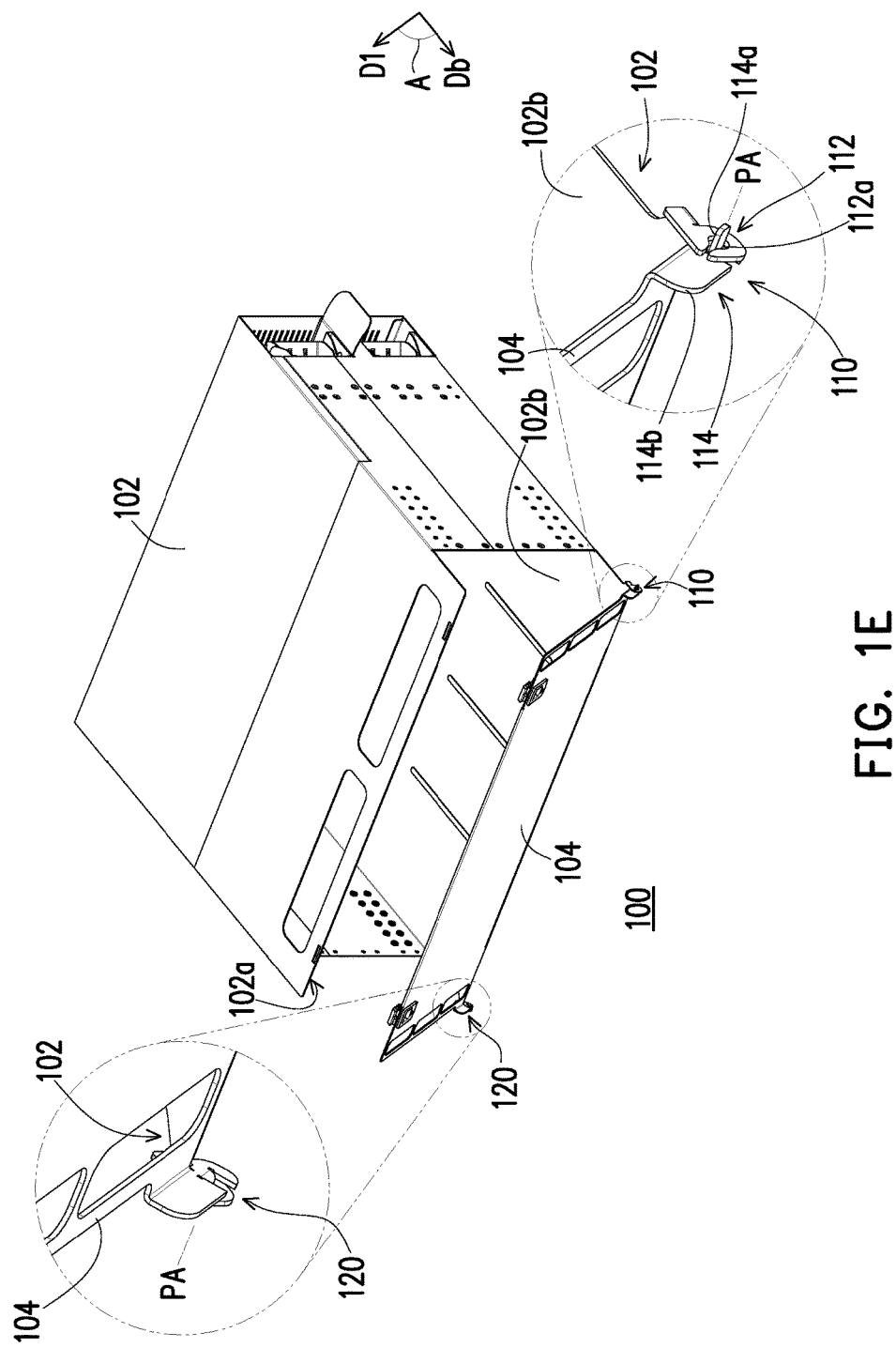

Referring to FIG. 1C to FIG. 1E, the first pivot assembly 110 is connected between the rear casing 102 and the door plate 104 along the pivot axis PA. The first pivot assembly 110 includes a first bearing portion 112 and a first shaft portion 114. The first bearing portion 112 is connected to one of the rear casing 102 and the door plate 104 (e.g., the rear casing 102 in this embodiment) and has a first shaft hole 112a and a first passage 112b. The first passage 112b extends from the first shaft hole 112a to an outer edge of the first bearing portion 112. The first shaft portion 114 is connected to the other one of the rear casing 102 and the door plate 104 (e.g., the door plate 104 in this embodiment) and has a first shaft body 114a. After the second pivot assembly 120 is assembled (as shown in FIG. 1B), the first shaft body 114a is moved into the first shaft hole 112a through the first passage 112b. As such, the first shaft body 114a is located in the first shaft hole 122a for limiting the door plate 104 to pivot relative to the rear casing 102.

Figure 1F:
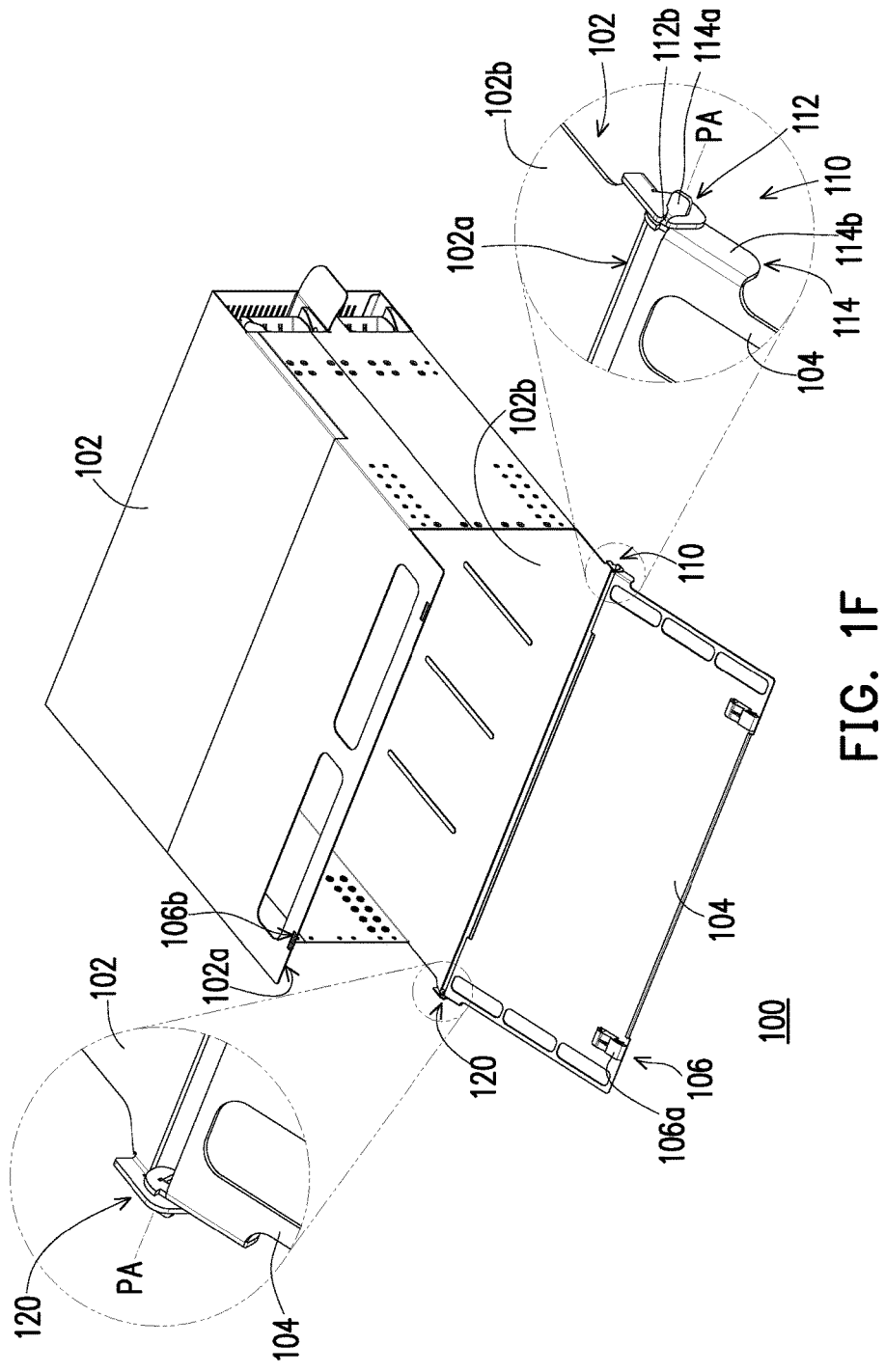

Referring to FIG. 1F, after the second pivot assembly 120 and the first pivot assembly 110 are assembled, the door plate 104 may be flipped along the pivot axis PA relative to the rear casing 102 for opening the opening 102a of the rear casing 102. In addition, referring to FIG. 1G, the door plate 104 may be flipped along the pivot axis PA relative to the rear casing 102 for sealing the opening 102a of the rear casing 102.

Figure 1G:
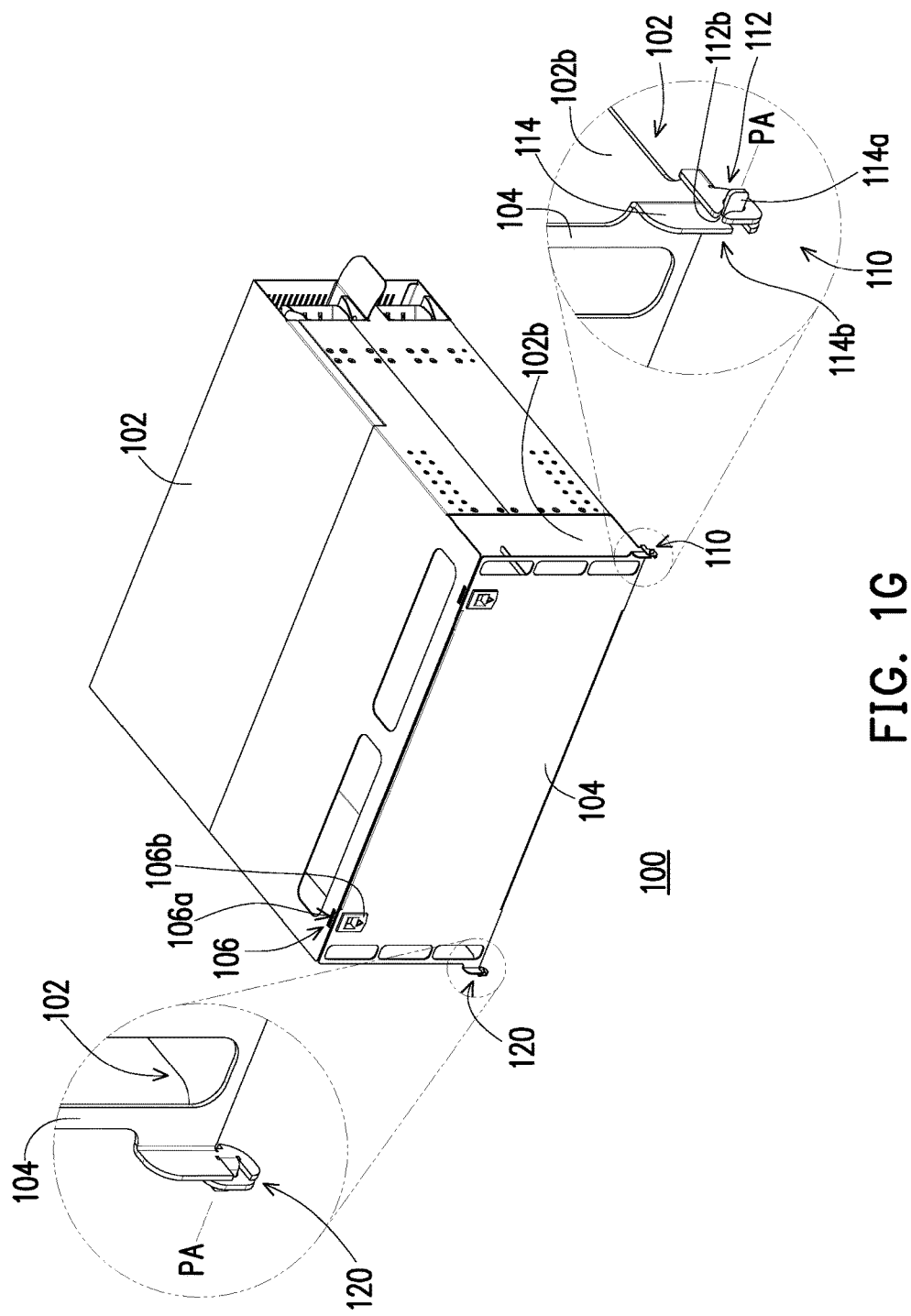

Referring to FIG. 1G, in this embodiment, the rack-mount chassis 100 further includes a plurality of fastening assemblies 106, but the invention is not limited thereto. The fastening assembly 106 is connected between the rear casing 102 and the door plate 104, so as to fasten a portion of the door plate 104 away from the pivot axis PA to a portion of the rear casing 102 away from the pivot axis PA. Specifically, the fastening assembly 106 may include a fastening member 106a and a fastening hole 106b as shown in FIG. 1F. The fastening member 106a is connected to or is formed on one of the rear casing 102 and the door plate 104 (e.g., the door plate 104 in this embodiment), and the fastening hole 106b is formed on the other one of the rear casing 102 and the door plate 104 (e.g., the rear casing 102 in this embodiment) for limiting a position of the fastening member 106a.

Referring to FIG. 1C to FIG. 1E, the first shaft body 114a is plate-like in this embodiment. Specifically, the rear casing 102 and the door plate 104 may be formed through mechanical processing on a plate material, and moreover, the first shaft body 114a may be constituted by a portion of said plate material. Therefore, a thickness of the first shaft body 114a is less than or equal to a width of the first passage 112b, and the width of the first passage 112b is less than or equal to an inner diameter of the first shaft hole 112a.

Referring to FIG. 1C to FIG. 1E, in this embodiment, when the first bearing portion 112 is connected to the rear casing 102, the rear casing 102 has a bottom wall 102b, and an included angle A between an extending direction Db of the bottom wall 102b and an extending direction D1 of the first passage 112b is less than or equal to 90 degrees. As such, a probability of the first shaft body 114a to be moved out from the first shaft hole 112a through the first passage 112b is lowered.

Referring to FIG. 1A to FIG. 1B, in this embodiment, the second shaft portion 124 further includes a second limiting piece 124b. The second shaft body 124a is connected to the other one of the rear casing 102 and the door plate 104 (e.g., the door plate 104 in this embodiment) through the second limiting piece 124b. Specifically, the door plate 104 (or the rear casing 102) may be formed through mechanical processing on a plate material, and moreover, the second limiting piece 124b may be constituted by a portion of said plate material.

Referring to FIG. 1C to FIG. 1E, in this embodiment, the first shaft portion 114 further includes a first limiting piece 114b, and the first shaft body 114a is connected to the other one of the rear casing 102 and the door plate 104 (e.g., the door plate 104 in this embodiment) through the first limiting piece 114b. Specifically, the door plate 104 (or the rear casing 102) may be formed through mechanical processing on a plate material, and moreover, the first limiting piece 114b may be constituted by a portion of said plate material.

In this embodiment, the first limiting piece 114b and the first bearing portion 112 are able to limit the door plate 104 to shift relative to the rear casing 102 along a direction of the pivot axis PA, and the second limiting piece 124b and the second bearing portion 122 are able to limit the door plate 104 to shift relative to the rear casing 102 along the other direction of the pivot axis PA.

Figure 2:
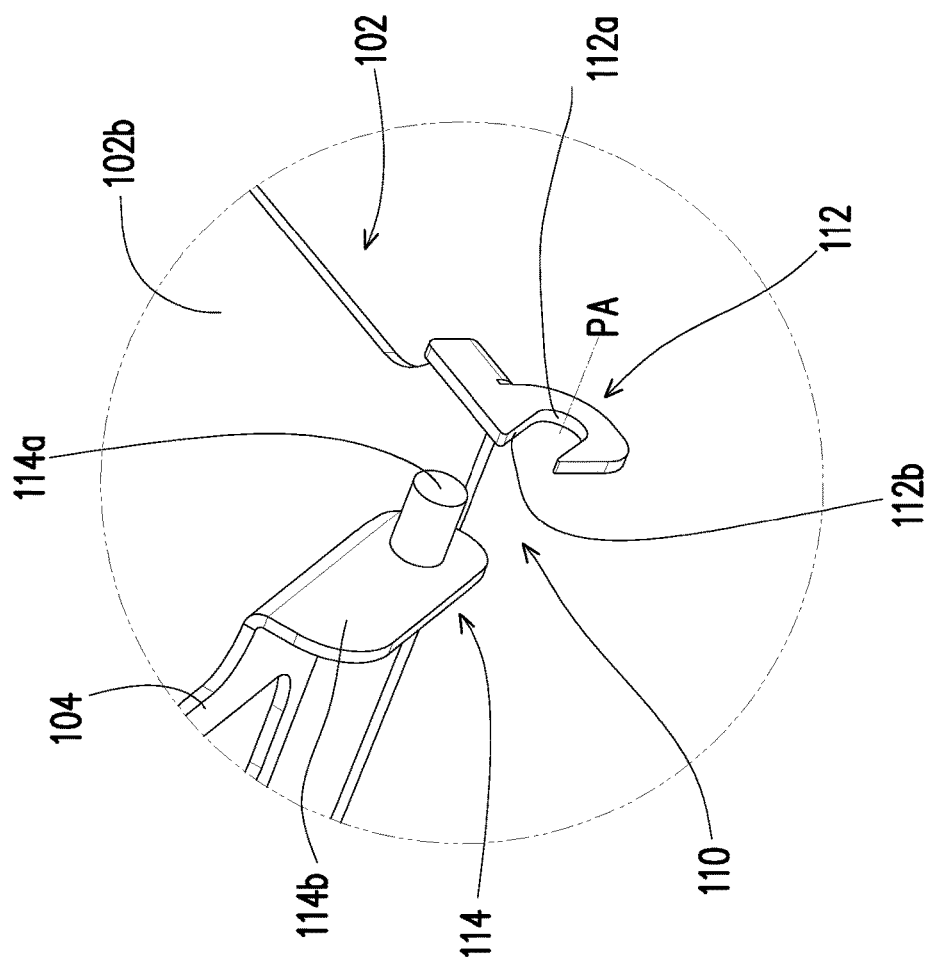
FIG. 2 is an exploded view of a first pivot assembly of a rack-mount chassis according to another embodiment of the invention.

Referring to FIG. 2, in this embodiment, compared to the plate-like first shaft body 114a disclosed in the embodiments of FIG. 1C to FIG. 1E, the first shaft body 114a may also be cylindrical-shaped. Specifically, the first shaft body 114a may be manufactured on the door plate 104 as an independent member. Correspondingly, the width of the first passage 112b correspondingly increases, as such, an outer diameter of the first shaft body 114a is less than or equal to the width of the first passage 112b.

Figure 3:
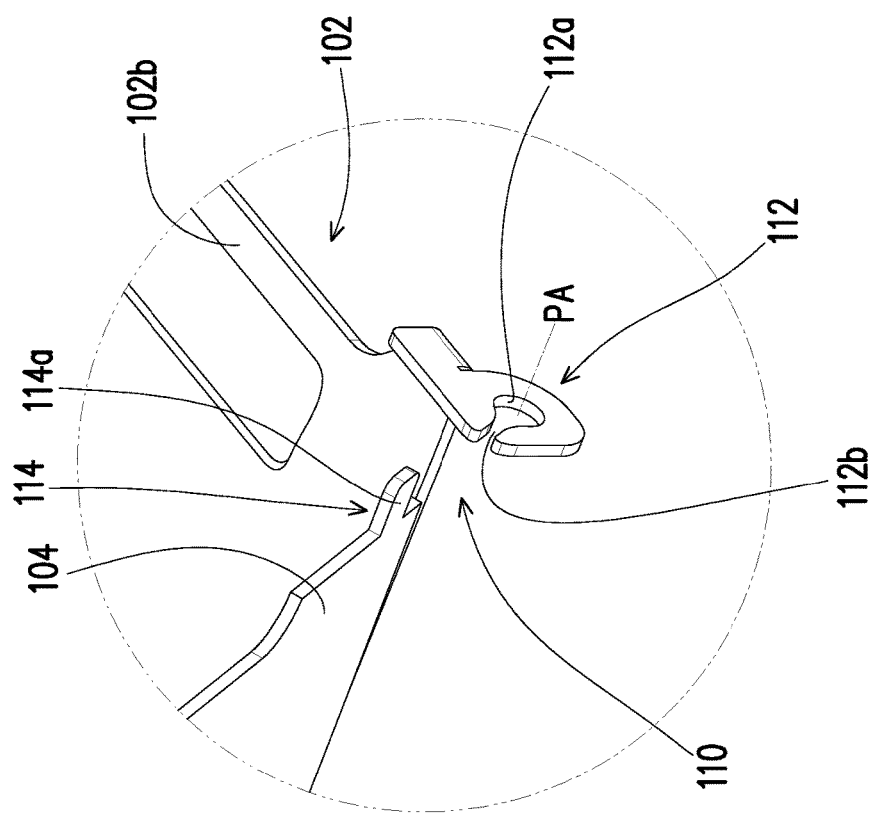
FIG. 3 is an exploded view of a first pivot assembly of a rack-mount chassis according to another embodiment of the invention.

Referring to FIG. 3, compared to the embodiments of FIG. 1C to FIG. 1E, the first limiting piece 114b may be omitted in this embodiment, and the first shaft body 114a is thus directly connected to the door plate 104. In another embodiment, when the first shaft portion 114 is connected to the rear casing 102, the first shaft body 114a may be directly connected to the rear casing 102. As such, an edge of the door plate 104 and the first bearing portion 112 are able to limit the door plate 104 to shift relative to the rear casing 102 along a direction of the pivot axis PA.

Figure 4A:
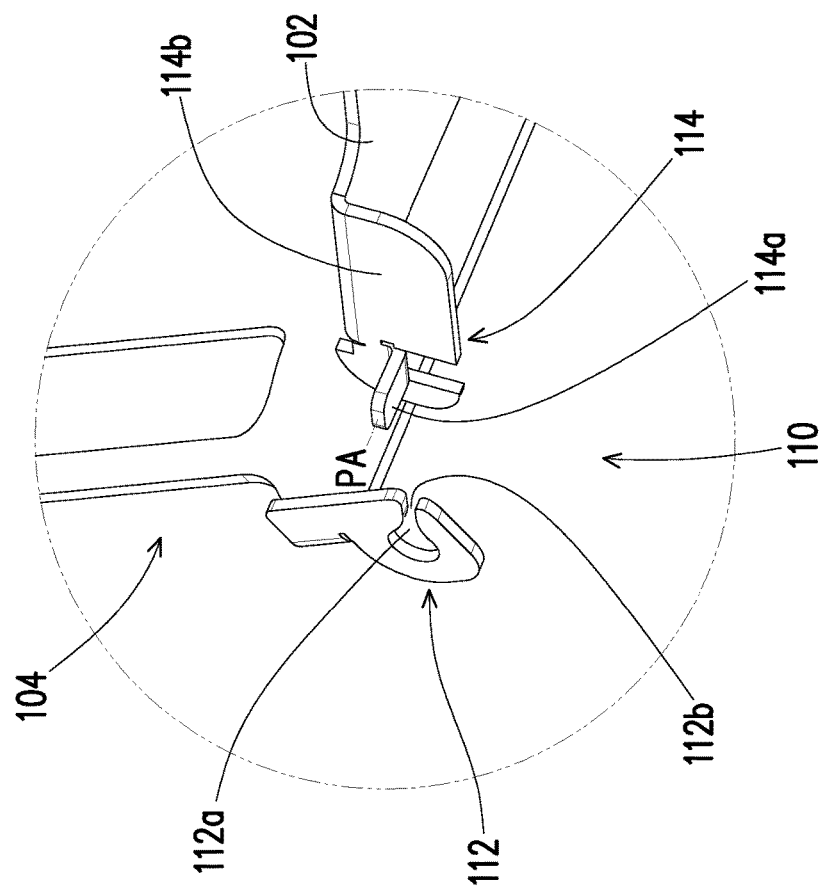
FIG. 4A to FIG. 4B illustrate an assembly process of a first pivot assembly of a rack-mount chassis according to another embodiment of the invention.
Figure 4B:
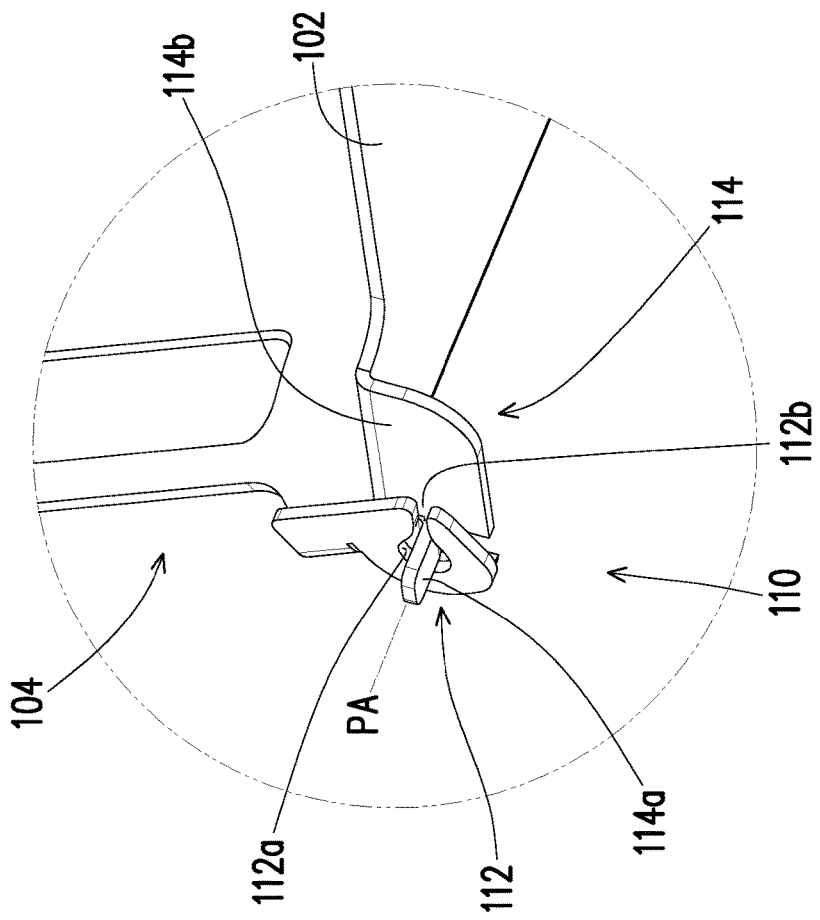

Referring to FIG. 4A to FIG. 4B, in this embodiment, compared to the embodiments of FIG. 1C to FIG. 1E, when the first shaft portion 114 is connected to the rear casing 102 and the first bearing portion 112 is connected to the door plate 104, the included angle A between an extending direction Dd of the door plate 104 and the extending direction D1 of the first passage 112b is less than or equal to 90 degrees. As such, the probability of the first shaft body 114a to be moved out from the first shaft hole 112a through the first passage 112b is lowered.

Figure 5A:
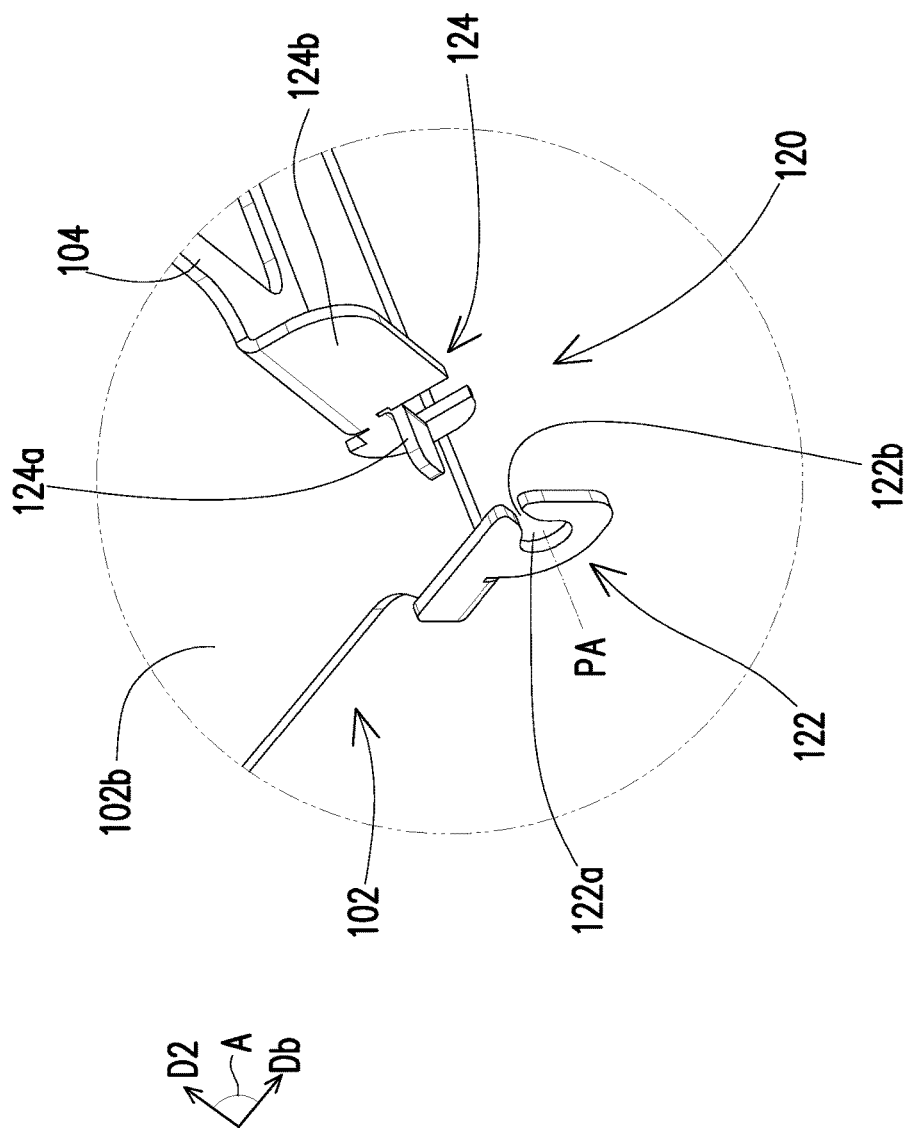
FIG. 5A to FIG. 5C illustrate an assembly process of a second pivot assembly of a rack-mount chassis according to an embodiment of the invention.
Figure 5B:
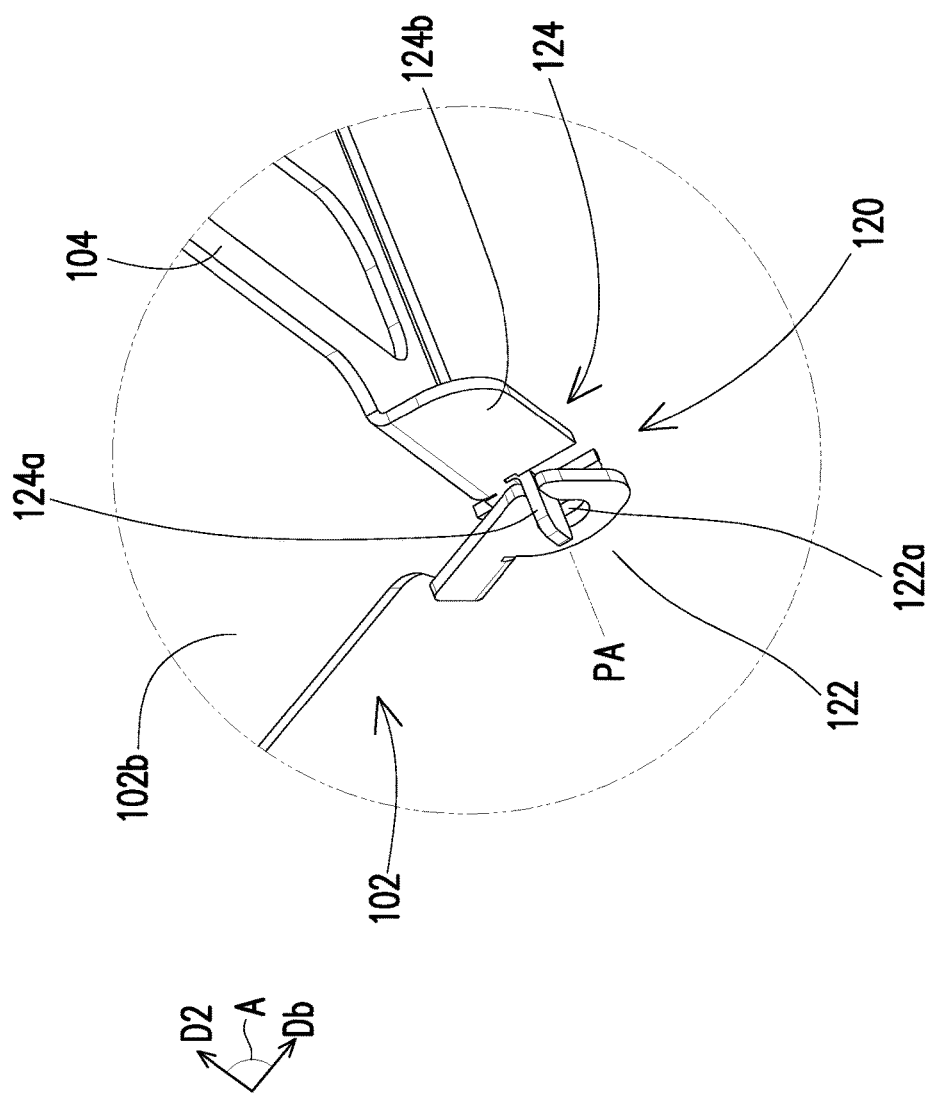
Figure 5C:
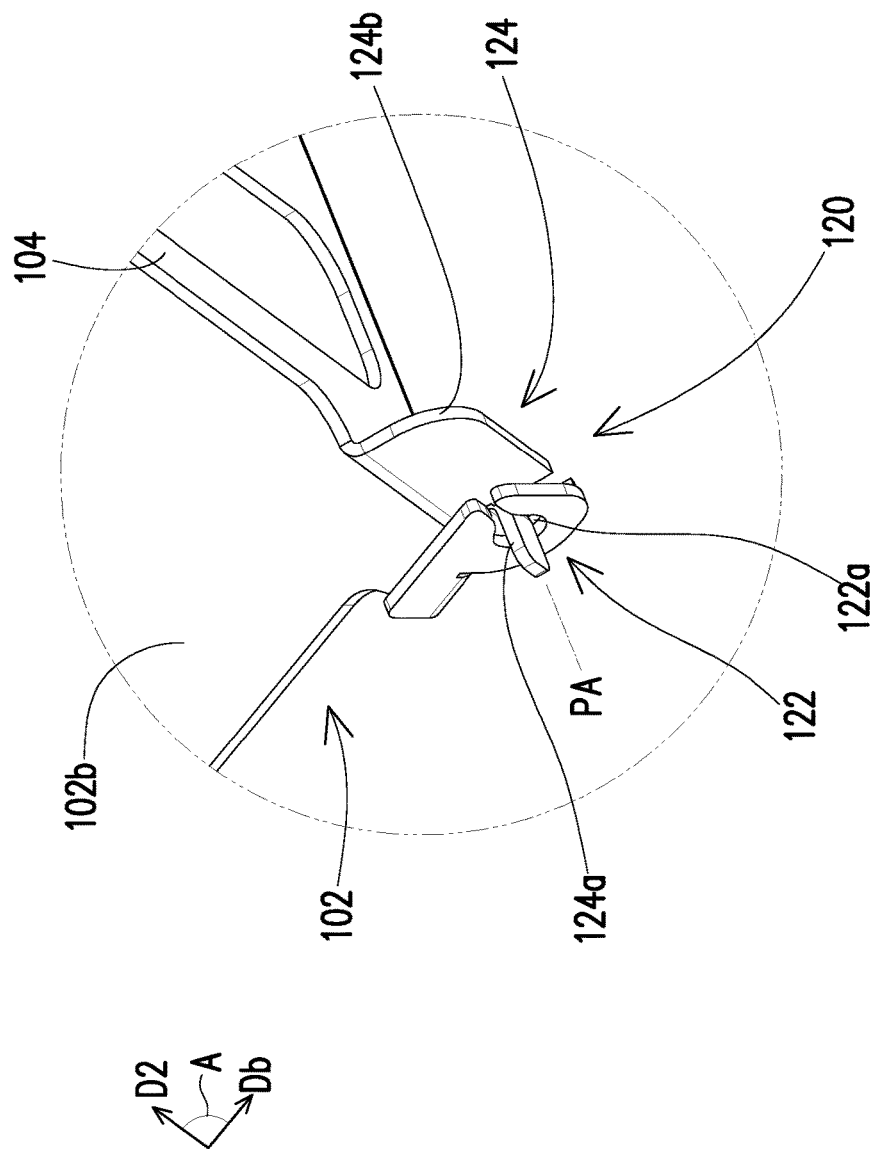

Referring to FIG. 5A to FIG. 5C, in this embodiment, compared to the embodiments of FIG. 1A to FIG. 1B, the second bearing portion 122 further includes a second passage 122b, wherein the second passage 122b extends from the second shaft hole 122a to an outer edge of the second bearing portion 122, and the second shaft body 124a is moved into the second shaft hole 122a from the second passage 122b.

Referring to FIG. 5A to FIG. 5C, the second shaft body 124a is plate-like in this embodiment. Specifically, the rear casing 102 and the door plate 104 may be formed through mechanical processing on a plate material, and moreover, the second shaft body 124a may be constituted by a portion of said plate material. Therefore, a thickness of the second shaft body 124a is less than or equal to a width of the second passage 122b, and the width of the second passage 122b is less than or equal to an inner diameter of the second shaft hole 122a.

Referring to FIG. 5A to FIG. 5C, in this embodiment, when the second bearing portion 122 is connected to the rear casing 102, the rear casing 102 has the bottom wall 102b, and the included angle A between the extending direction Db of the bottom wall 102b and an extending direction D2 of the second passage 122b is less than or equal to 90 degrees. As such, a probability of the second shaft body 124a to be moved out from the second shaft hole 122a through the second passage 122b is lowered.

Referring to FIG. 5A to FIG. 5C, in this embodiment, the second shaft portion 124 further includes the second limiting piece 124b, and the second shaft body 124a is connected to the other one of the rear casing 102 and the door plate 104 (e.g., the door plate 104 in this embodiment) through the second limiting piece 124b. Specifically, the door plate 104 (or the rear casing 102) may be formed through mechanical processing on a plate material, and moreover, the second limiting piece 124b may be constituted by a portion of said plate material.

Referring to FIG. 6, in this embodiment, compared to the plate-like second shaft body 124a disclosed in the embodiments of FIG. 5A to FIG. 5C, the second shaft body 124a may also be cylindrical-shaped. Specifically, the second shaft body 124a may be manufactured on the door plate 104 as an independent member.

Correspondingly, the width of the second passage 122b correspondingly increases, as such, an outer diameter of the second shaft body 124a is less than or equal to the width of the second passage 122b.

Figure 7:
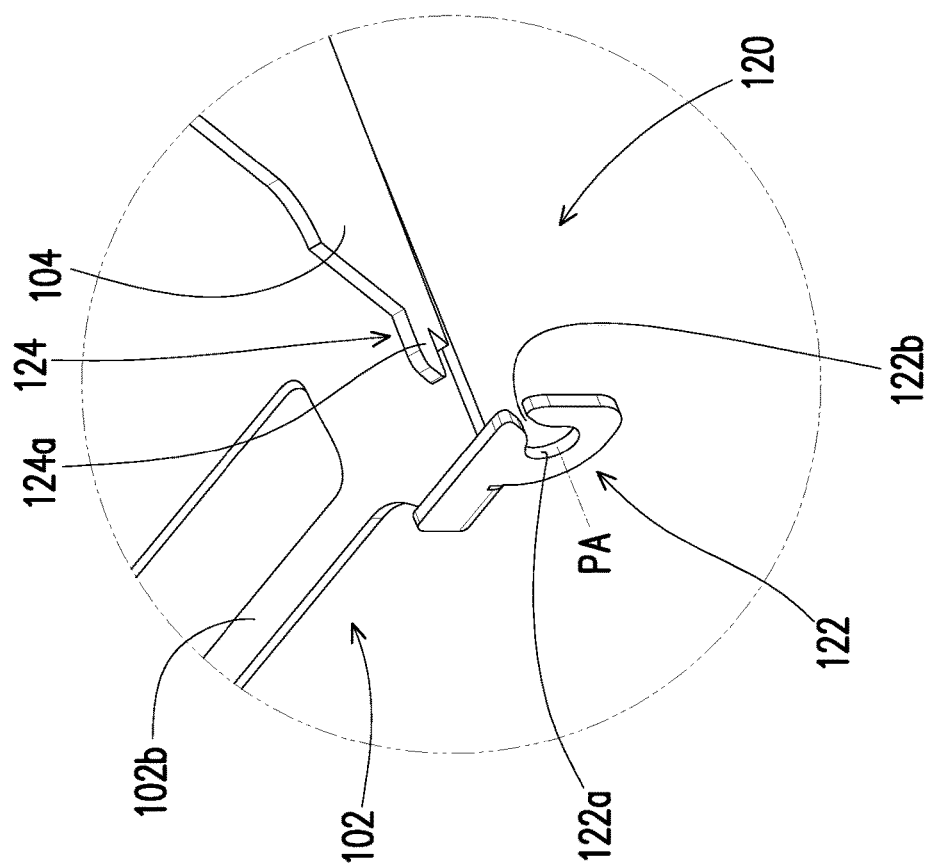
FIG. 7 is an exploded view of a second pivot assembly of a rack-mount chassis according to another embodiment of the invention.

Referring to FIG. 7, compared to the embodiments of FIG. 5A to FIG. 5C, the second limiting piece 124b may be omitted in this embodiment, and the second shaft body 124a is thus directly connected to the door plate 104. In another embodiment, when the second shaft portion 124 is connected to the rear casing 102, the second shaft body 124a may be directly connected to the rear casing 102. As such, the edge of the door plate 104 and the second bearing portion 122 are able to limit the door plate 104 to shift relative to the rear casing 102 along the other direction of the pivot axis PA.

Figure 8A:
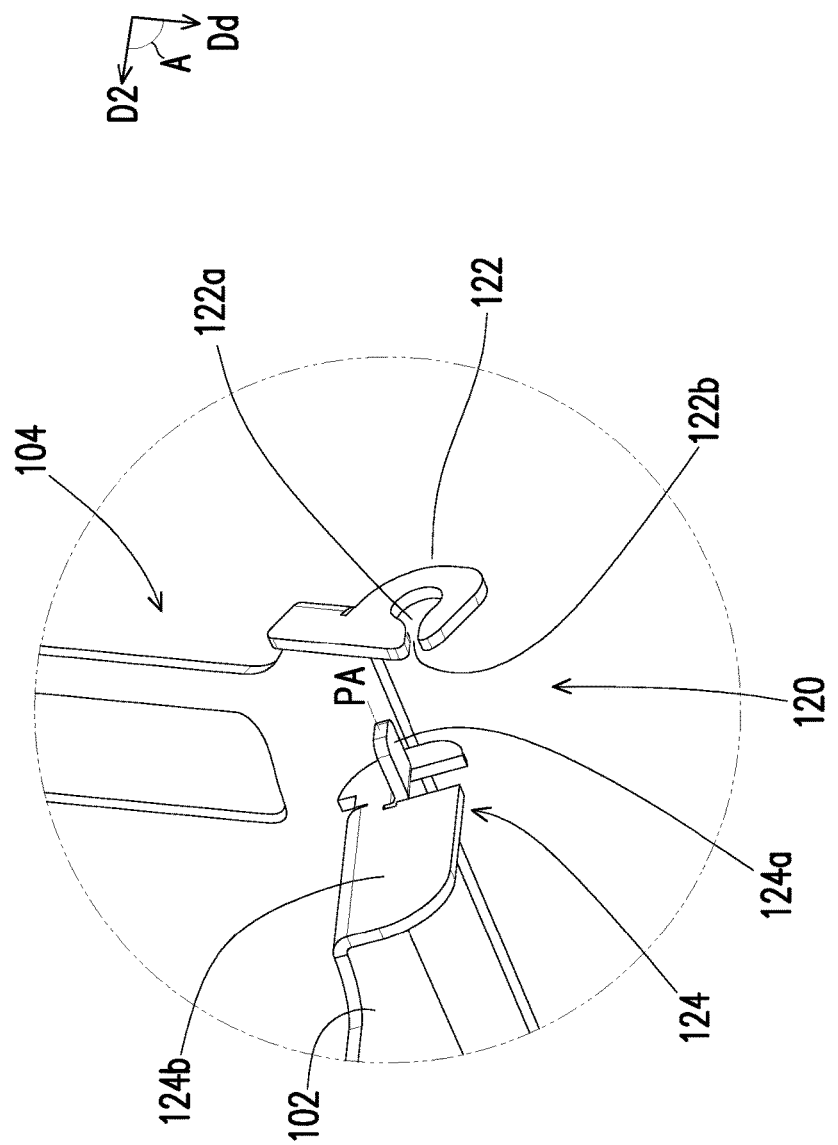
FIG. 8A to FIG. 8B illustrate an assembly process of a second pivot assembly of a rack-mount chassis according to another embodiment of the invention.
Figure 8B:
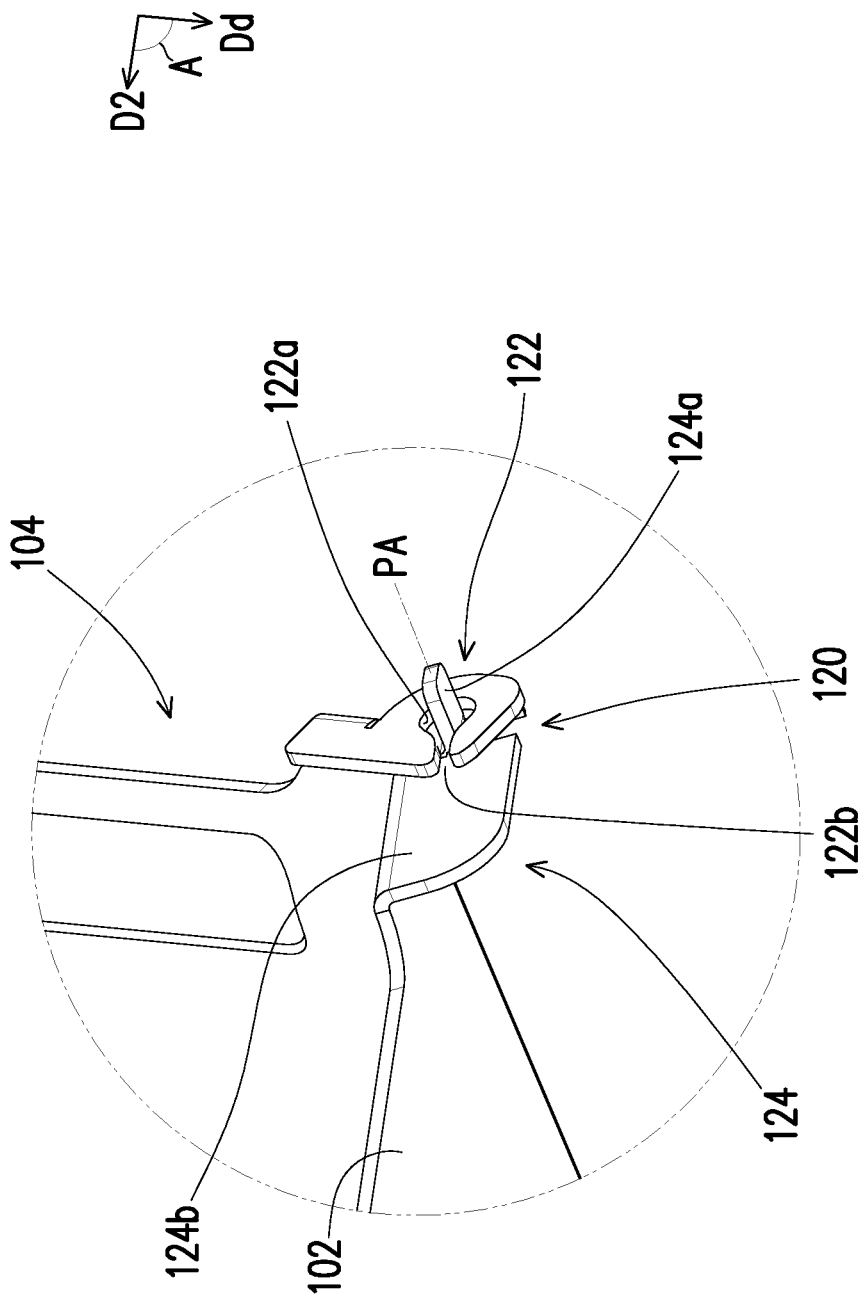

Referring to FIG. 8A to FIG. 8B, in this embodiment, compared to the embodiments of FIG. 5A to FIG. 5C, when the second shaft portion 124 is connected to the rear casing 102 and the second bearing portion 122 is connected to the door plate 104, the included angle A between the extending direction Dd of the door plate 104 and an extending direction D2 of the second passage 122b is less than or equal to 90 degrees. As such, the probability of the second shaft body 124a to be moved out from the second shaft hole 122a through the second passage 122b is lowered.

In view of the foregoing, the detachable pivot assembly provided by the embodiments of the invention allows the door plate to be replaced more conveniently. Therefore, when the door plate is selective (e.g., the door plate may be transparent or opaque), the door plate may be replaced conveniently.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A rack-mount chassis, comprising:
    a rear casing having an opening;
    a door plate configured to cover the opening;
    a first pivot assembly connected between the rear casing and the door plate along a pivot axis, the first pivot assembly comprising:
        a first bearing portion connected to one of the rear casing and the door plate and having a first shaft hole and a first passage, wherein the first passage extends from the first shaft hole to an outer edge of the first bearing portion; and
        a first shaft portion connected to the other one of the rear casing and the door plate and having a first shaft body, wherein the first shaft body is moved into the first shaft hole through the first passage; and a second pivot assembly connected between the rear casing and the door plate along the pivot axis, the second pivot assembly comprising:

a second bearing portion connected to one of the rear casing and the door plate and having a second shaft hole; and a second shaft portion connected to the other one of the rear casing and the door plate and having a second shaft body, wherein the second shaft body is located in the second shaft hole.

2. The rack-mount chassis as claimed in claim 1, wherein the first shaft body is plate-like, a thickness of the first shaft body is less than or equal to a width of the first passage, and the width of the first passage is less than or equal to an inner diameter of the second shaft hole.

3. The rack-mount chassis as claimed in claim 1, wherein the first shaft body is cylindrical-shaped, and an outer diameter of the first shaft body is less than or equal to a width of the first passage.

4. The rack-mount chassis as claimed in claim 1, wherein the rear casing has a bottom wall when the first bearing portion is connected to the rear casing, and an included angle between an extending direction of the bottom wall and an extending direction of the first passage is less than or equal to 90 degrees.

5. The rack-mount chassis as claimed in claim 1, wherein an included angle between an extending direction of the door plate and an extending direction of the first passage is less than or equal to 90 degrees when the first bearing portion is connected to the door plate.

6. The rack-mount chassis as claimed in claim 1, wherein the first shaft portion further comprises a first limiting piece, and the first shaft body is connected to the other one of the rear casing and the door plate through the first limiting piece.

7. The rack-mount chassis as claimed in claim 1, wherein the second shaft body is inserted into the second shaft hole along the pivot axis.

8. The rack-mount chassis as claimed in claim 1, wherein the second bearing portion further comprises a second passage, wherein the second passage extends from the second shaft hole to an outer edge of the second bearing portion, and the second shaft body is moved into the second shaft hole through the second passage.

9. The rack-mount chassis as claimed in claim 1, wherein the second shaft body is plate-like, a thickness of the second shaft body is less than or equal to a width of the second passage, and the width of the second passage is less than or equal to an inner diameter of the second shaft hole.

10. The rack-mount chassis as claimed in claim 1, wherein the second shaft body is cylindrical-shaped, and an outer diameter of the second shaft body is less than or equal to a width of the second passage.

11. The rack-mount chassis as claimed in claim 1, wherein the rear casing has a bottom wall when the second bearing portion is connected to the rear casing, and an included angle between an extending direction of the bottom wall and an extending direction of the second passage is less than or equal to 90 degrees.

12. The rack-mount chassis as claimed in claim 1, wherein an included angle between an extending direction of the door plate and an extending direction of the second passage is less than or equal to 90 degrees when the second bearing portion is connected to the door plate.

13. The rack-mount chassis as claimed in claim 1, wherein the second shaft portion further comprises a second limiting piece, and the second shaft body is connected to the other one of the rear casing and the door plate through the second limiting piece.

14. The rack-mount chassis as claimed in claim 1, further comprising:

a fastening assembly connected between the rear casing and the door plate so as to fasten a portion of the door plate away from the pivot axis to a portion of the rear casing away from the pivot axis.

\* \* \* \* \*